United States Patent
Bajai et al.

(10) Patent No.: US 12,020,856 B2
(45) Date of Patent: Jun. 25, 2024

(54) SENSFORMER

(71) Applicant: Siemens Aktiengesellschaft, Munich (DE)

(72) Inventors: Laszlo Bajai, Vackisujfalu (HU); Tobias Kemper, Nuremberg (DE); Bruno Moreno Stuck, Nuremberg (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 823 days.

(21) Appl. No.: 17/049,085

(22) PCT Filed: Apr. 20, 2018

(86) PCT No.: PCT/EP2018/060223
§ 371 (c)(1),
(2) Date: Oct. 20, 2020

(87) PCT Pub. No.: WO2019/201451
PCT Pub. Date: Oct. 24, 2019

(65) Prior Publication Data
US 2021/0241971 A1 Aug. 5, 2021

(51) Int. Cl.
*H01F 27/40* (2006.01)
*G01R 31/62* (2020.01)
(Continued)

(52) U.S. Cl.
CPC ........... *H01F 27/402* (2013.01); *G01R 31/62* (2020.01); *H01F 27/02* (2013.01); *H01F 27/24* (2013.01);
(Continued)

(58) Field of Classification Search
CPC ......... G01R 31/62; H01F 27/02; H01F 27/24; H01F 27/28; H01F 27/40; H01F 2027/404; H01F 2027/406
(Continued)

(56) References Cited

FOREIGN PATENT DOCUMENTS

| CN | 103117597 A | 5/2013 |
| CN | 104157118 A | * 11/2014 |

(Continued)

OTHER PUBLICATIONS

English translation of PAN CN-107393682A (Year: 2017).*
English translation of Chong CN-105513751A (Year: 2016).*
English translation of Zhu CN-104157118A (Year: 2014).*

*Primary Examiner* — Jermele M Hollington
*Assistant Examiner* — Courtney G McDonnough
(74) *Attorney, Agent, or Firm* — Laurence A. Greenberg; Werner H. Stemer; Ralph E. Locher (57) ABSTRACT

A device for reactive power compensation in a high-voltage network. A high-voltage connection is provided for each phase of the high-voltage network. Each high-voltage connection is connected to a first high-voltage winding surrounding a first core portion and to a second high-voltage winding surrounding a second core portion. The core portions are part of a closed magnetic circuit. Low-voltage ends of each high-voltage winding can be connected to at least one saturation switching branch which is configured to saturate the core portions and has actuatable power semiconductor switches, which are actuated by a control unit. Each saturation switching branch has at least one two-pole submodule with a bridge circuit having power semiconductor switches and a DC voltage source. Depending on the actuation of the power semiconductor switches, the DC voltage source can either be connected in series to at least one high-voltage winding or can be bridged.

15 Claims, 5 Drawing Sheets

(51) Int. Cl.
*H01F 27/02*     (2006.01)
*H01F 27/24*     (2006.01)
*H01F 27/28*     (2006.01)

(52) U.S. Cl.
CPC ....... *H01F 27/28* (2013.01); *H01F 2027/406* (2013.01)

(58) Field of Classification Search
USPC .................................................. 324/754.23
See application file for complete search history.

(56) References Cited

FOREIGN PATENT DOCUMENTS

| | | | | |
|---|---|---|---|---|
| CN | 105513751 A | * | 4/2016 | ........... H01F 27/402 |
| CN | 105632142 A | | 6/2016 | |
| CN | 105655100 A | | 6/2016 | |
| CN | 107393682 A | * | 11/2017 | ........... H01F 27/402 |
| EP | 1470948 A1 | | 10/2004 | |
| WO | 2012142355 A1 | | 10/2012 | |
| WO | WO-2015067844 A1 | * | 5/2015 | ............. G01N 25/58 |
| WO | 2016066373 A1 | | 5/2016 | |
| WO | WO-2016066373 A1 | * | 5/2016 | ........... G01R 31/027 |

\* cited by examiner

SENSFORMER

BACKGROUND OF THE INVENTION

Field of the Invention

The present invention relates to an electrical device for connecting to a high-voltage network, comprising a magnetizable core, at least one winding which is configured for generating a magnetic field in the core, and a group of measurement sensors which provide measurement signals on the output side.

Such an electrical device is, for example, known from WO 2012/142355 A1. A range of transformers is disclosed there, which are populated with so-called "online sensors." The online sensors detect, for example, the moisture in the oil of a transformer, the state of its bushing, a step switch, or a cooling system. In addition, it is provided to detect online sensors for the upper oil temperature, the winding temperature, the status of relays, for example, the Buchholz relay, and to transmit them to a central computing system. The central computing system can furthermore be provided with so-called "offline data," and comprises both hardware components and software components. The central computing system evaluates the measurement signals, such that it is possible to determine whether the transformer populated with the respective online sensor must be maintained soon or runs the risk of failing.

Electrical devices designed as transformers are used for converting a higher voltage to a lower voltage or vice-versa, and are used in all areas of electrical energy transmission and distribution. Power transformers are used for the transmission of electrical energy over long distances at high voltages in the range of approximately 50 kV to 1000 kV. In particular at high operating voltages, power transformers may have a weight of several hundred tons and may correspond to the size of a single-family house. Distribution transformers are comparatively compact and may, for example, also be attached to a utility pole or a rail vehicle. All transformers have in common a core and windings which are inductively coupled to one another. During operation, the windings are at a high-voltage potential. An insulating material is used for insulating and cooling the winding, which, in the case of power transformers, may be a fluid, for example, an oil, an ester liquid, or a gas.

Distribution transformers may also comprise a tank which is filled with insulating fluid. In deviation therefrom, however, it is also possible to design the distribution transformers as so-called dry-type transformers, wherein the windings are embedded in a solid object, for example, an epoxy resin, instead of a fluid or gaseous insulating medium.

In the event of a fault, transformers constitute a component which is critical for the safety of the network supply, since the energy supply is interrupted by the failure of the transformer. It is therefore desirable to be able to monitor the state of the transformer remotely and thus online, in order to prevent a failure if possible.

The electrical device initially specified has the disadvantage that the measurement sensors must be individually Internet-capable. This allows a flexible adjustment of the measurement sensors to the respective site of operation of the electrical device. However, on the other hand, network-capable measurement sensors are complex, prone to failure, and expensive.

SUMMARY OF THE INVENTION

The object of the present invention is to provide an electrical device of the kind initially specified, which is economical and which simultaneously can be flexibly adapted to the respective requirements of the entire field of energy transmission and distribution.

The present invention achieves this object in that the at least one communication unit is provided with a housing in which a GSM module and a plurality of analog measurement inputs and a plurality of digital measurement inputs are arranged, wherein a plurality of measurement sensors is connected to a communication unit, and the respective communication unit is configured for processing the measurement data obtained from the various measurement signals.

The electrical device according to the present invention is populated with a communication unit which comprises a housing including a plurality of measurement inputs, such that an entire range of different sensors which are arranged in the electrical device can be flexibly connected to the respective communication unit. If, for example, the electrical device is a transformer which is used in a transmission network having voltages above 50 kV, said transformer generally comprises a vessel or tank which is filled with an insulating fluid. The core and winding are arranged inside the tank. In this case, temperature sensors are generally required which are used for measuring the fluid temperature in the tank. In contrast, so-called dry-type transformers, which are used for distributing power in distribution networks having voltages up to 50 kV, comprise different sensors which, for example, are configured for measuring a winding temperature or a winding current. In order to be able to use the same communication unit for all electrical devices, within the scope of the present invention, said communication unit is populated with a plurality of analog and digital inputs. In addition, according to the present invention, a so-called GSM module is provided, via which the measurement signals collected by the communication unit can be transmitted to a remote, for example, cloud-based computing unit, via a known standard. Subsequently, the central monitoring of a plurality of electrical devices which are also positioned in a distributed manner may take place there. On the one hand, the high adaptability of the communication unit to the respectively required sensors, and on the other hand, the shared transmission of the processed measurement signals, provide a decisive advantage with respect to the system initially specified having an entire array of separate network-capable sensors. Within the scope of the present invention, it is also possible that the electrical device comprises sensors which are not connected to the communication unit.

Within the scope of the present invention, the communication unit comprises a housing which is used for accommodating its electronic components and supporting them collectively. The housing is advantageously made from a plastic, a sintered material, or metal, and may, for example, be arranged in a switch cabinet of the electrical device. In the case of some electrical devices, the arrangement of the communication unit in a switch cabinet or another component of the electrical device which provides the necessary protection from contamination or damaging weather conditions is not possible or is undesirable. In these cases, the communication unit comprises a protective housing which is also made from a plastic, a sintered material, or a metal, and in which all remaining components of the communication unit are arranged. Preferably, the communication unit comprises a housing and a protective housing which protectively encapsulates the housing. The protective housing is equipped with signal cable bushings which allow signal cables to pass through the wall of the protective housing. A plurality of signal cables may be routed together through a signal cable bushing. The weatherproof protective housing is preferably equipped with attachment means, with the aid of which the communication unit, for example, is attached externally to the electrical device which is placed in the open. However, in particular in the case of distribution transformers, it is also possible that they are arranged in a building, wherein the communication unit is attached internally or externally to a wall of the building.

Within the scope of the present invention, the electrical device is preferably a transformer or an inductor. Furthermore, it is possible that the electrical device comprises a plurality of communication units, wherein, however, each communication unit is connected to a plurality of sensors.

Preferably, the group of measurement sensors comprises a winding current sensor which is configured to detect a winding current flowing through the winding, and a position sensor which is used for determining the spatial position of an electrical device. According to this advantageous refinement, measurement sensors are used which are suitable both for electrical devices which comprise a tank filled with an insulating fluid, and for solid-insulated electrical devices. Said sensors may be used independently of the type of the respective electrical device. It is thus possible to reduce costs. The position sensor can generally be configured in any manner. For example, the position sensor is a position specification which is stored on a memory unit of the communication unit and which is readable externally. Preferably, however, the position sensor is configured as a GPS antenna which can be detected by satellites circling in orbit. Here, GPS stands for the Global Positioning System which is known to those skilled in the art.

In addition, the communication unit comprises a resistance thermometer. Resistance thermometers generally comprise a measurement probe made of a material of which the electrical resistance is a function of temperature. For example, the measurement probe comprises a platinum matrix and has a quiescent resistance of approximately 100 ohms. Such a resistance temperature sensor is also referred to as a Pt100 sensor. Pt100 sensors are generally connected via multiwire cables to the communication unit, which comprises a suitable input for these measurement sensors. As a result, the flexibility for using the communication module is increased.

In addition, it may be advantageous that each communication unit comprises a USB receptacle and a so-called Ethernet receptacle. The USB or Ethernet receptacles are used for reading out the stored parameters of the communication unit on-site and/or for accessing a logic unit which is part of the communication unit, and with the aid of which the mode of operation of the communication unit when detecting and processing the received measurement signals can be adjusted. The Ethernet receptacle furthermore allows the connection to the Internet.

Advantageously, the position sensor is arranged outside the housing of the communication unit. A so-called GPS antenna is suitable as a position sensor, are already explained above. The GPS (Global Positioning System) antenna must be detected by satellites for determining the position. Due to the removable attachment of the position sensor, it can be separated from the communication unit and, for example, arranged outside the building, which would otherwise shield an antenna arranged in the interior. The GPS antenna may advantageously be connected to the remaining components of the communication unit via a GPS signal input.

The communication unit may comprise an internal timer for time signaling. The timer may, for example, take place via a GPS antenna. In deviation therefrom, an additional timer is provided which operates according to a so-called NTP time synchronization protocol.

According to a different variant, the electrical device comprises a tank filled with an insulating fluid, wherein the group of sensors comprises a temperature sensor in the upper area of the tank and a temperature sensor in the lower area of the tank, which are respectively configured for detecting the temperature of the insulating fluid. According to this variant, measurement sensors are provided and are connected to the communication unit, and are configured for detecting the upper and lower temperatures of the insulating fluid. In deviation therefrom, the temperature of the insulating fluid is detected only on one side of the tank of the electrical device.

According to a further variant, each winding is embedded in an electrically nonconductive solid and is populated with a winding temperature sensor which is configured for detecting the temperature of the winding. Such winding temperature sensors are preferably used for so-called dry-type transformers.

Advantageously, the communication unit comprises a coprocessor which is connected to the measurement inputs on the input side and to a central processing unit on the output side, wherein a memory unit is provided which is connected to the central processing unit. The distribution of the computing power is advantageous and ensures error-free operation of the communication unit.

According to a refinement which is advantageous in this regard, the coprocessor is configured for receiving and for sampling the measurement signal, thereby obtaining measured values, for digitizing the measured values, thereby obtaining measurement data, averaging the digitized measurement data, and forwarding the averaged measurement data to the central processing unit. The coprocessor is thus used for preprocessing and in particular for assembling measurement data packets which contain the measurement data of the various sensors. The measurement data of a measurement data packet are averaged. The measurement data packets are routed to the central processing unit. Preferably, averaging is performed over one second, wherein, every second, the coprocessor forms the average value of the measurement data which it has derived from the various measurement signals of the measurement sensors. Of course, the duration of the averaging by the coprocessor can be changed by corresponding parameterization by the communication unit, such that the duration of the averaging is changed.

According to a refinement which is advantageous in this regard, the central processing unit is configured for receiving the digital averaged measurement data and further processing said measurement data, thereby obtaining processed measurement data, for storing the processed measurement data in the memory unit, and for transmitting the reprocessed measurement data to the GSM module. Within the scope of the present invention, the preprocessed measurement data are provided to the central processing unit, which, for example, carries out further averaging of the measurement data arriving every second, and averages said data over a minute, and stores the re-averaged measurement data in the memory unit. These measurement data are simultaneously routed to the central computing unit via the GSM module. The averaging period of the central processing unit can be adjusted by means of corresponding parameterization.

Advantageously, the communication unit comprises a logic unit. The logic unit may, for example, be activated via the USB interface or via the Ethernet input. In addition, the logic unit is also used to actuate the so-called GSM module or to be actuated from a cloud via the GSM module. The logic unit is software which receives queries, input commands, or parameters from said interfaces and executes corresponding instructions.

Advantageously, the communication unit comprises a protective housing equipped with access openings, in which the housing is completely encapsulated. The protective housing is used for protecting the electronic components of the communication unit from contamination and other harmful environmental influences, for example, snow, rain, solar radiation, and extraordinarily high or low temperatures. The signal lines can be routed to the housing comprising the measurement inputs, via the access openings. A plurality of signal lines may also be routed through an access opening.

The protective housing comprises, for example, attachment means for attaching the communication unit directly to the other components of the electrical device. In one variant, the communication unit is arranged inside a switch cabinet. A switch cabinet which is present in any case may be used within the scope of the present invention for accommodating the communication unit.

The connection of the measurement sensors which are arranged in the electrical device to the communication unit can in principle be performed in any manner and generally takes place via a data connection route. The data connection route may, for example, be configured as a signal cable, wherein the signal cables, for example, are routed out of a tank filled with insulating fluid, in a fluid-tight manner. In deviation therefrom, however, wireless transmission of the measurement signals to the communication unit is possible within the scope of the present invention.

Additional expedient embodiments and advantages of the present invention are disclosed in the following description of exemplary embodiments of the present invention, with reference to the figures of the drawing, wherein identical reference signs refer to identically acting components.

DETAILED DESCRIPTION OF THE INVENTION

Figure 1:
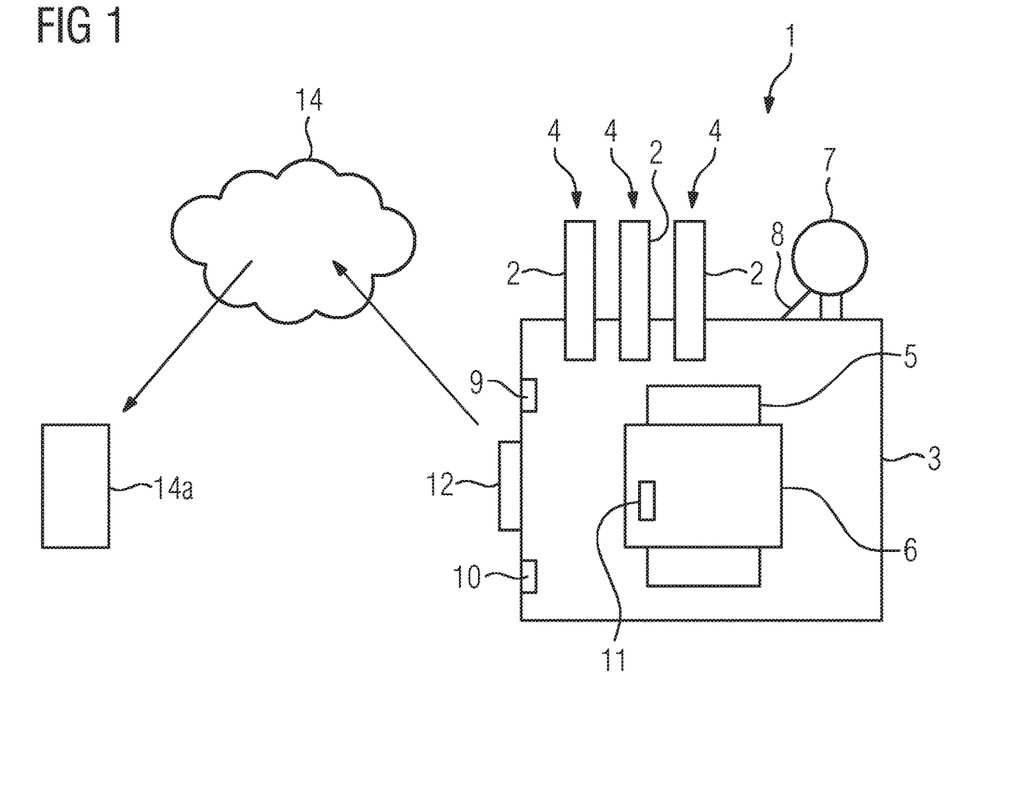
FIG. 1 illustrates a schematic side view of an exemplary embodiment of the electrical device according to the present invention.

FIG. 1 depicts an exemplary embodiment of the electrical device according to the present invention, which is configured here as a transformer 1. The depicted transformer 1 is a power transformer and is provided for connection to a 345 kV high-voltage network. For each phase of high-voltage network carrying the AC voltage, a high-voltage bushing 2 is provided which is attached to a tank 3 of the transformer 1 via attachment means which are not figuratively depicted. On their end facing away from the attachment means, each high-voltage bushing 2 is equipped with an open-air connector which is used for installing an air-insulated open-air conductor. A core 5 which is made up of a magnetizable material, here, iron, is arranged inside the tank 3. The core 5 forms a closed magnetic circuit and comprises three core limbs, of which only one is apparent in FIG. 1. The core limbs are respectively enclosed by windings which are arranged concentrically with respect to one other, wherein, in FIG. 1, only one higher-voltage winding 6 is apparent, which encloses an inner lower-voltage winding and an auxiliary winding. Each higher-voltage winding 6 is connected to one of the depicted high-voltage bushings 2 via a connection line which is not figuratively depicted. The lower-voltage windings are connected to output bushings and/or to cable receptacles via connection lines which are also not depicted. The transformer 1 transforms the input voltage, here, 345 kV, to a lower output voltage, here, 175.5 kV.

For cooling the electrical insulation of the active portion surrounding the core 5 and the windings 6, the tank 3 is filled with an insulating fluid, here, an ester oil, wherein, for equalizing temperature-related volume fluctuations of the ester fluid, an equalization container 7 is provided, which is connected to the inner space of the tank 3 via a connection channel 8. In the upper area of the tank 3, a temperature sensor 9 is apparent on its inner wall, wherein an additional temperature sensor 10 is attached in the lower area of the tank 3. The temperature sensors 9 and 10 are configured to detect the respectively locally prevailing temperature of the insulating fluid, i.e., the ester fluid. In addition, a temperature sensor 11 is provided for measuring the winding temperature of the higher-voltage winding 6. The sensors 9, 10, and 11 are connected to a communication unit 12 which will be described later in greater detail, via signal lines which are not depicted.

The communication unit 12 collects the incoming measurement signals, digitizes them, thereby obtaining measurement data, and averages them over a predetermined period of time. Finally, the averaged measurement data are stored in a memory unit of the communication unit which is not figuratively depicted in FIG. 1. In addition, the communication unit 12 comprises a GSM module which enables communication with a computing unit 14a which may also be designated as a component of a so-called cloud 14. The averaged measurement data are conveyed to the GSM module and are transmitted by it to the cloud 14.

Figure 2:
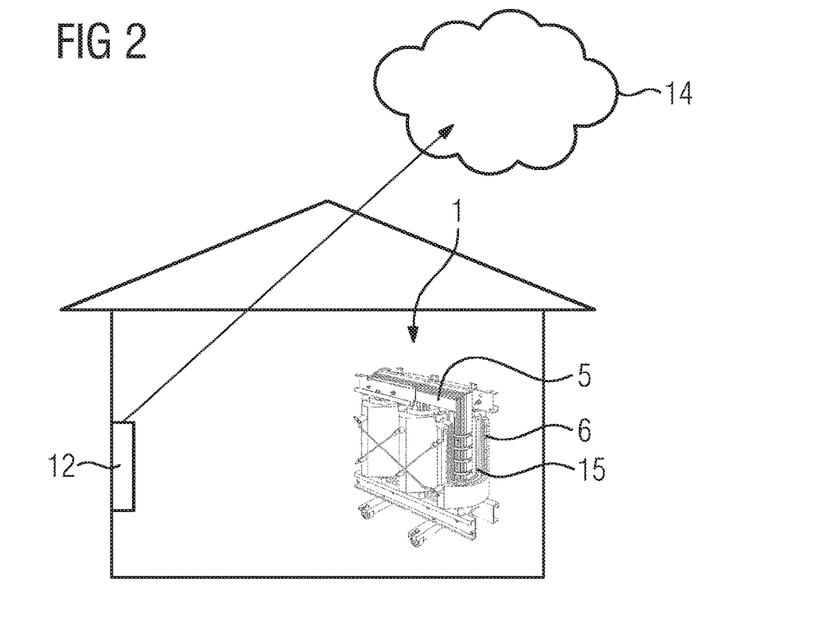
FIG. 2 illustrates a schematic representation of an additional exemplary embodiment of the electrical device, FIG. 3 schematically illustrates a logical depiction of an exemplary embodiment of the communication unit of an electrical device according to FIG. 1 or 2, FIG. 4 schematically illustrates an exemplary embodiment of an analogous measurement input of a communication unit according to FIG. 3, FIG. 5 schematically illustrates an exemplary embodiment of a Pt100 input of the communication unit according to FIG. 3, FIG. 6 schematically illustrates an exemplary embodiment of a protective housing of the communication unit, FIG. 7 schematically illustrates an additional exemplary embodiment of the device according to the present invention, FIG. 8 schematically illustrates an exemplary embodiment of the device according to the present invention differing from FIG. 7, and FIG. 9 schematically illustrates an exemplary embodiment of a detachable position sensor.

FIG. 2 shows a further exemplary embodiment of the electrical device according to the present invention, which is again configured as a transformer 1, wherein, however, the transformer 1 is a so-called dry-type transformer 1.

Here as well, the transformer 1 comprises a core 5 which is made up of an upper horizontally extending yoke and three perpendicular limbs which are respectively enclosed by a plurality of concentric windings, wherein the higher-voltage windings 6 and a lower-voltage winding 15 are apparent in the depicted sectional view. As is customary, the core 5 is formed from iron plates which are adjacent to one another, such that eddy currents are suppressed. The transformer 1 is furthermore equipped with sensors which are not figuratively depicted, wherein a temperature sensor which is not depicted is used for detecting the winding temperature. In addition, the respective winding current is measured with the aid of a current measurement sensor. The sensors are connected, via signal lines which are also not depicted, to the communication unit 12, which is again populated with a GSM module, and which collects the measurement signals received by the measurement sensors, and averages and processes them, and transmits them to the cloud 14 for monitoring purposes. Of course, within the scope of the present invention, it is also possible to attach the communication unit directly to a dry-type transformer.

Figure 3:
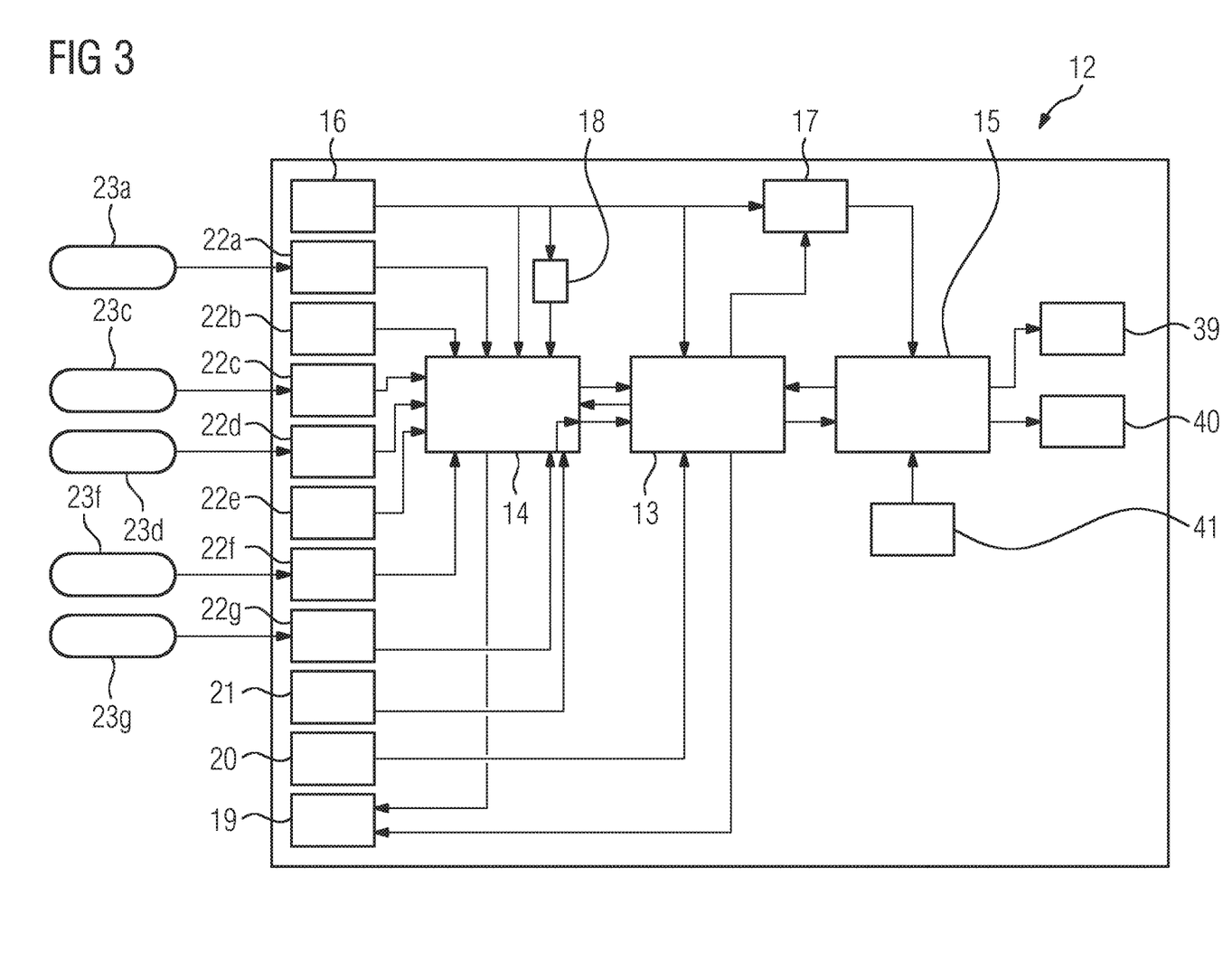

FIG. 3 shows a logical depiction the structure of the communication unit 12. The communication unit 12 comprises a central processing unit 13 and a coprocessor 14 which are arranged in a housing which is not depicted in FIG. 3. In addition, a GSM module 15 is depicted which has already been described. For supplying energy, a network supply input 16 is provided via which the coprocessor 14 and the central processing unit 13 can be supplied with electrical energy. Furthermore, an energy switch 17 is apparent which can be actuated by the central processing unit 13, in order to connect the GSM module 15 to the network supply input or to disconnect said module from said input. Furthermore, an energy storage unit 18 is provided which, for example, is configured as a rechargeable battery or as a battery.

The central processing unit 13 and the coprocessor 14 are coupled to a status display 19 which can be examined externally, and which, in the depicted exemplary embodiment, is an optical status display 19 in the form of LEDs. The LEDs display the respective state of the central processing unit 13 and the coprocessor 14. An Ethernet input 20 is apparent above the status display 19, and above it, a so-called USB receptacle 21 is apparent. The USB receptacle 21 is connected to the coprocessor 14, and the Ethernet receptacle 20 is connected to the central processing unit 13.

Furthermore, measurement inputs 22a to 22g are apparent, which are connected to the coprocessor 14 on the output side. The measurement inputs 22a and 22b are so-called digital inputs. The measurement inputs 22c, 22d, and 22e are designed as analog inputs. The measurement input 22f is an input for a resistance thermometer which is configured as a so-called Pt100 sensor. The input 22g is a so-called RS-485 input. RS-485, also known as TIA-485, refers to a standard for asynchronous serial data transmission. This standard is known to those skilled in the art; thus, a more exact description may be omitted here. The wide range of measurement inputs 22a to 22g makes it possible to use the communication unit 12 flexibly for such electrical devices, which are common in the field of electrical energy transmission and distribution.

It is not actually necessary to use all measurement inputs 22a to 22g. In the depicted exemplary embodiment, only one digital input is connected to a measurement sensor 23a, whereas the digital input 22b remains free and is not connected to any sensor. The analog input 22c is connected to a so-called 4-20 mA sensor 23c. The sensor 23d, which is connected to the analog measurement input 22d, is a so-called +/−20 mA sensor. The differences will be discussed later in greater detail in conjunction with FIG. 4.

The analog input 22e also remains free in the depicted exemplary embodiment. The sensor 23f is a so-called Pt100 sensor. The sensor 23g is an RS-485 sensor which provides measurement signals according to the RS-485 standard on the output side.

Figure 4:
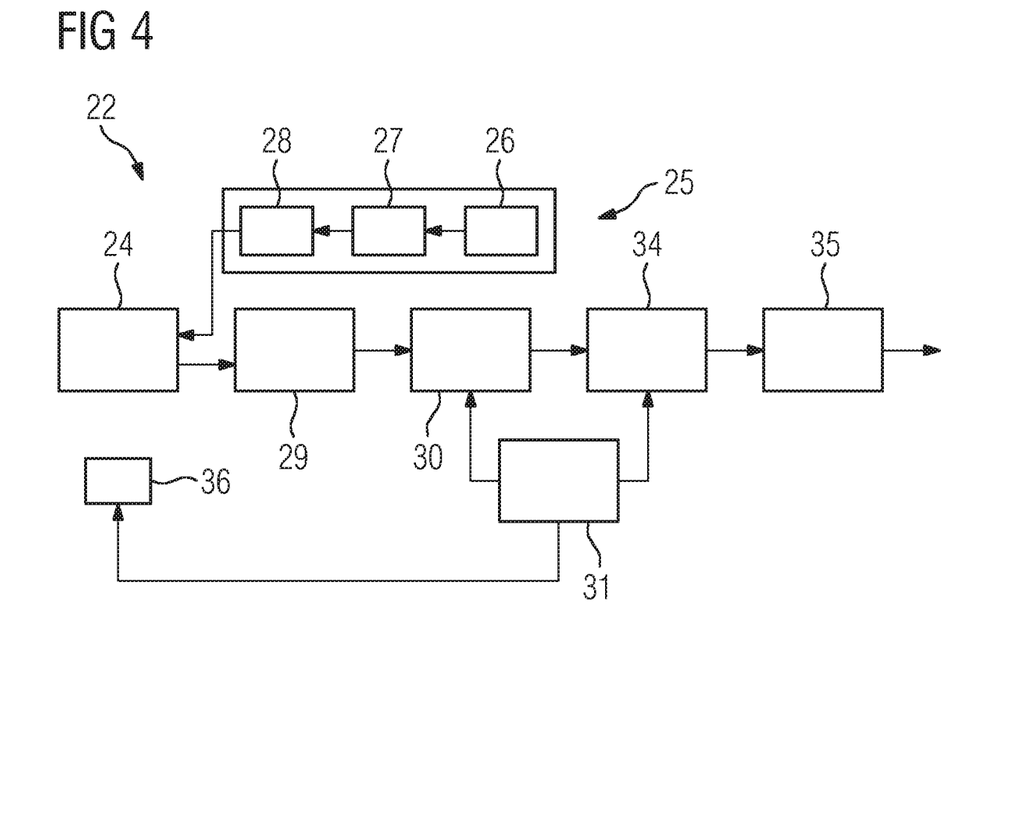

FIG. 4 depicts a structure of an analog input based on the example of the analog input 22c of FIG. 3, wherein, however, the analog inputs 22d and 22e are configured identically. The analog input 22c comprises a receptacle 24 which is configured for accommodating a plug of the sensor 22c having a complementary shape. In order to extend the variety of applications of the analog inputs, an energy supply 25 is provided for each analog input, such that an actively measuring sensor, for example, a 4-20 mA current sensor, can be supplied with a voltage or a current. The energy supply unit 25 comprises the actual energy source 26, overcurrent protection 27, and polarization protection 28. Furthermore, overvoltage protection 29 is provided. Subsequently, a resistance unit 30 follows, of which the inner resistance can be changed by a selector switch 31 from 60 ohms to 120 ohms or vice-versa. The selector switch 31 is connected to a balancing element 34 to which a filter, for example, a Butterworth filter 35, is in turn connected downstream. The filter 35 smooths the incoming analog measurement signals, which are subsequently sampled, thereby obtaining sampling values, whereupon the sampling values are digitized by an analog/digital converter which is not figuratively depicted. With the aid of the selector switch 31, it is possible to change the analog measurement input 22c from a so-called 4-20 mA standard to a +/−20 mA sensor, wherein the respectively adjusted state is optically displayed via an LED display 36 on the exterior of the housing. In the depicted exemplary embodiment, the change takes place autonomously, such that the flexibility of the communication box 12 is increased yet more.

Figure 5:
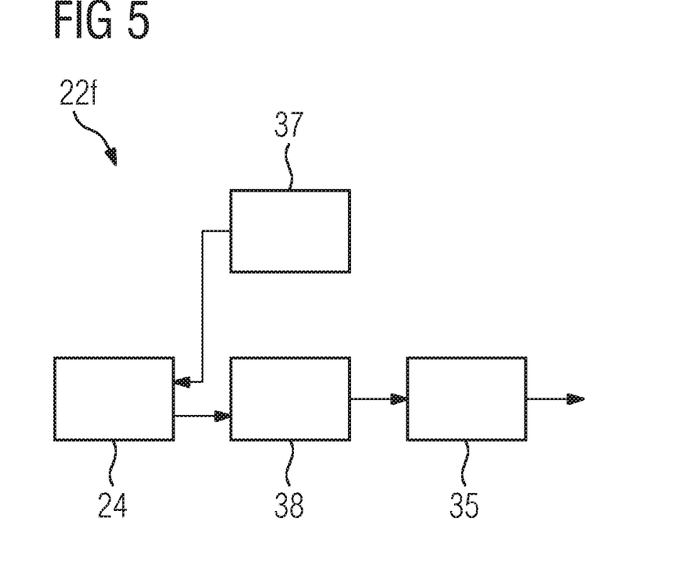

FIG. 5 depicts the input for a Pt100 sensor more exactly as a resistance thermometer 22f. A Pt100 sensor is connected to the input receptacle 24 via a three-element signal cable. A current source 37 is connected to the input receptacle 24 and provides the measurement current necessary for the Pt100 sensor. Downstream from the input receptacle 24, there is a resistance balancing unit 38, and then another filter unit 35 which provides the smoothing necessary for the digitization. The smoothed measurement signals provided on the output side in FIGS. 4 and 5 are digitized by the coprocessor, as described above, thereby obtaining digital measurement data. The coprocessor averages the digital measurement data over a first averaging range, for example, over one second, and provides the averaged measurement data to the central processing unit 13, which assumes the further processing. Thus, the central processing unit 13 comprises, for example, a memory unit which is not figuratively depicted, in which the average values averaged by it, for example, over a second averaging period, are stored. The average values are furthermore supplied to the GSM module 15 (see FIG. 3), which is connected on the output side to a GSM antenna 39 and a position sensor antenna 40. Both the GSM antenna 39 and the position sensor antenna 40 are preferably arranged outside the housing. With the aid of the GSM antenna 39, the twice-averaged measurement data are provided via a mobile radio connection to the cloud computer 14a shown in FIG. 1.

The position sensor antenna is preferably a GPS antenna. The GPS antenna is part of a global positioning system which can be located by distributed satellites orbiting the earth, such that the position of the device can also be transmitted to the cloud computer 14a.

Finally, the communication unit 12 also comprises a so-called SIM card reader 41 (FIG. 3), which is connectable to the GSM module 15.

Figure 6:
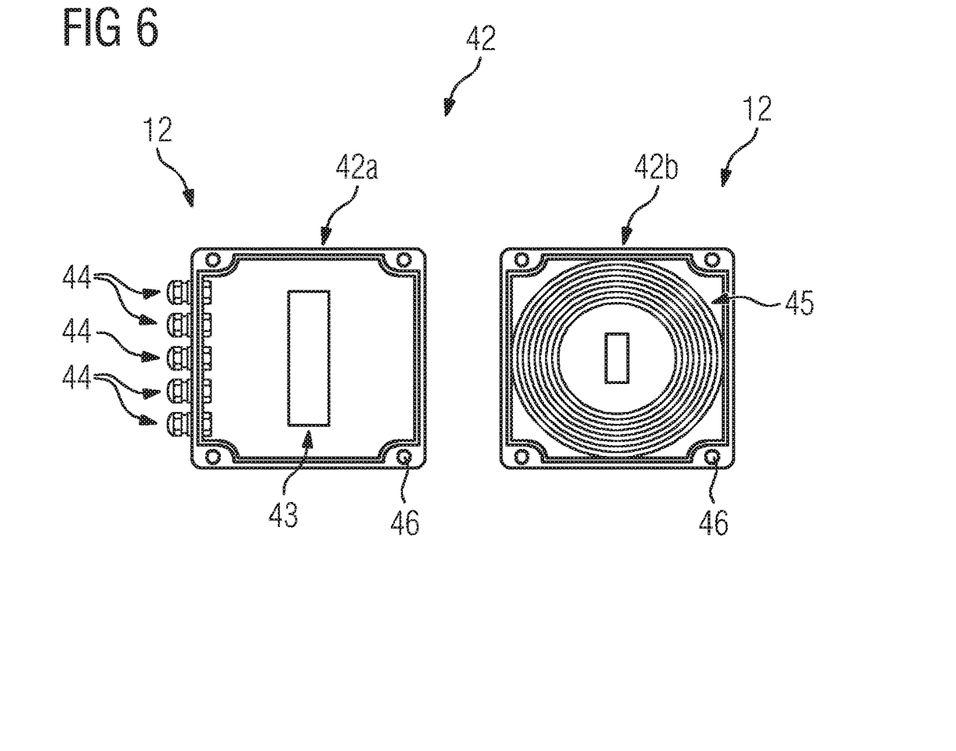

FIG. 6 depicts an exemplary embodiment of a protective housing 42 of a communication unit 12 according to the present invention. A top view of a bottom piece 42a is depicted on the left-hand side of FIG. 6, and a top view of a top piece 42b of the protective housing 42 is depicted on the right-hand side. It is apparent that the bottom piece 42a of the protective housing 42 comprises a flat bottom wall on which attachment means are provided 43 which are used for attaching an inner housing, which is not figuratively depicted, in the protective housing 42 in which the previously described electronic components are arranged, with the exception of the antennas. Side walls protrude from the bottom wall of the bottom piece 42a, i.e., from the plane of the drawing, which enclose a protective space on all sides. One of said four side walls is equipped with access openings 44 which are arranged adjacent to one another in a row. The access openings 44 allow feeding the signal lines connected to the measurement sensors to the inputs of the communication unit 12 which are formed on the inner housing. Access openings which are not required are sealed with a sealing element which is not depicted. The top part 42b comprises a dome-shaped dome section 45, of which the side walls overlap the side walls of the bottom piece 42a all sides, with some play. For each feed opening 44, a feed-in slit is provided on a wall of the dome section of the cover part 42b.

After the housing has been arranged in the bottom part 42a and is attached to it, the cover part 42b can be put over the side walls of the bottom part 42a and mechanically connected to it, for example, via a screw connection. For this purpose, feed-through holes 46 are formed in the cover part 42b. Via the feed-through holes which are apparent in the bottom part 42a, the protective housing 42 can, for example, be attached to the outside of a tank or to a dry-type transformer. The housing which is arranged in the protective housing 42 is completely encapsulated by said protective housing, and is thus protected from contamination and harmful environmental influences, for example, snow or rain. The dome section has enough space to accommodate the GPS and GPS antennas, which are not arranged in the inner housing.

Figure 7:
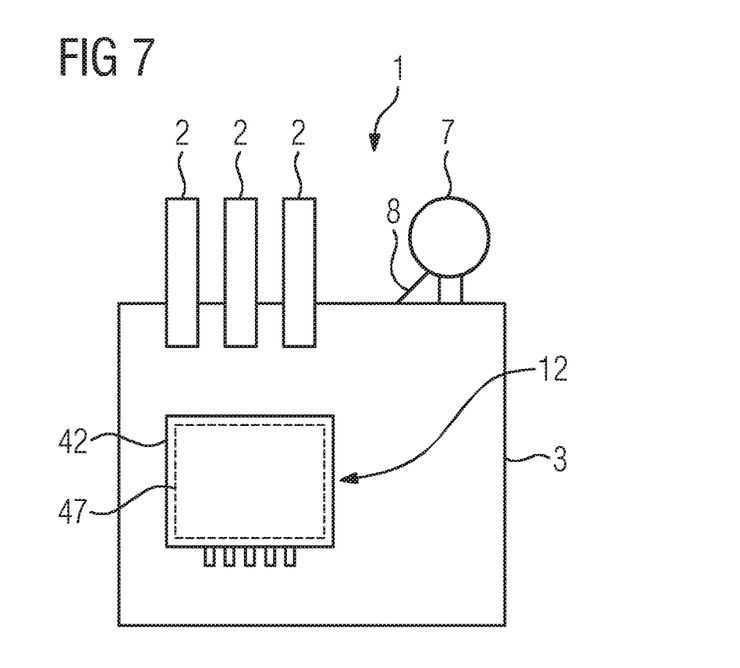

FIG. 7 depicts an additional exemplary embodiment of the electrical device according to the present invention, which again is configured as a power transformer 1 and which comprises a tank 3 filled with an insulating fluid. The additional housing 42, in the interior of which the housing 47 is indicated by dashed lines, is attached to the tank 3.

Figure 8:
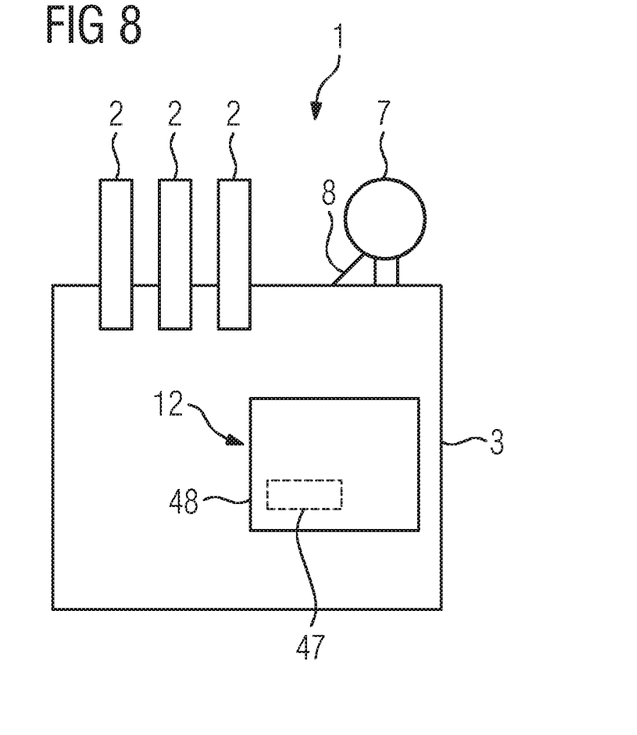

FIG. 8 depicts an exemplary embodiment of the electrical device 1 according to the present invention which differs from FIG. 7 in that the communication unit 12 is arranged along with its housing 47 inside a switch cabinet 48 of the electrical device 1. In this case, the switch cabinet 48 provides the necessary protection for the communication unit 12 from external influences. An additional protective housing is therefore not provided.

If the housing 47 is encapsulated by the protective housing 42, the GSM antenna and the GPS antenna are arranged outside the inner housing 47 but still inside the protective housing 42. The cover part 42b of the protective housing 42 is designed correspondingly.

Within the scope of the present invention, however, it is also possible to design the GPS antenna 40 and/or the GSM antenna 39 respectively as an exterior antenna, such that said antennas 39 and 40 can be attached, for example, to the outside of a tank or an outer wall of a building, without protection by an additional housing. This is, for example, necessary if the housing 47 as depicted in FIG. 7 is arranged inside a switch cabinet 48, which is generally metallic 48. The metal cabinet 48 would shield the antenna which is arranged in it too strongly.

Figure 9:
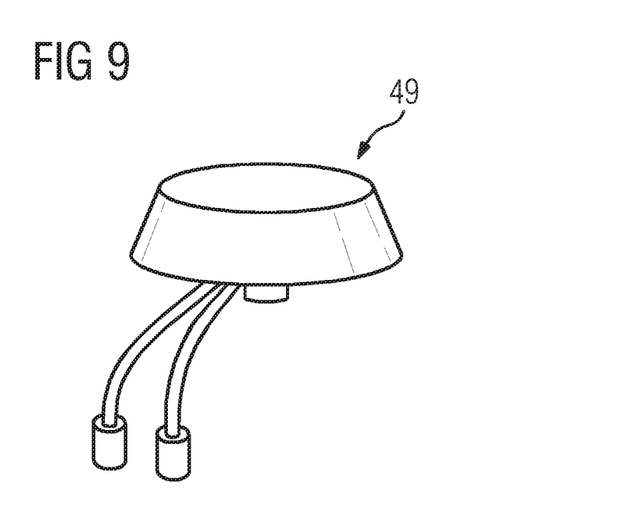

FIG. 9 depicts an exemplary embodiment of a separate antenna 49 which comprises both the GSM antenna 39 and the GPS antenna 40. The depicted separate antenna 49 is configured as an exterior antenna and comprises an outer cover beneath which said antennas 39, 40 are protectively arranged. A connection line is routed out of the cover at the bottom for each antenna 39, 40.

The invention claimed is:

1. An electrical device for connection to a high-voltage supply system, the electrical device comprising:
   a magnetizable core;
   at least one winding which is configured for generating a magnetic field in said core;
   a group of measurement sensors having outputs for providing measurement signals;
   at least one communication unit having a housing containing a GSM module, a plurality of analog measurement inputs, and a plurality of digital measurement inputs respectively connected to said outputs of some of said measurement sensors;
   said plurality of analog measurement inputs each having an enemy supply unit with an enemy source, overcurrent protection, and polarization protection; and
   said at least one communication unit being configured for processing measurement data obtained from the measurement signals received at said measurement inputs.

2. The electrical device according to claim 1, wherein said group of measurement sensors comprises:
   a winding current sensor configured to detect a winding current flowing through the at least one winding; and
   a position sensor which is used for determining a spatial position of the electrical device.

3. The electrical device according to claim 1, wherein said at least one communication unit comprises an input for a resistance thermometer.

4. The electrical device according to claim 1, wherein said at least one communication unit comprises a USB receptacle and an Ethernet receptacle.

5. The electrical device according to claim 2, wherein said position sensor is arranged outside the housing of the respective communication unit.

6. The electrical device according to claim 1, wherein said at least one communication unit comprises an internal timer.

7. The electrical device according to claim 1, further comprising a tank filled with insulating fluid, wherein said group of measurement sensors comprises a temperature sensor in an upper area of said tank and a temperature sensor in a lower area of the tank, said temperature sensors being respectively configured for detecting a temperature of the insulating fluid.

8. The electrical device according to claim 1, wherein said at least one winding is embedded in an electrically nonconductive solid and is populated with a winding temperature sensor configured for detecting a temperature of said winding.

9. The electrical device according to claim 1, wherein said at least one communication unit comprises a central processing unit, a coprocessor with an input side connected to said measurement inputs and an output side connected to said central processing unit, and a memory unit connected to said central processing unit.

10. The electrical device according to claim 9, wherein said coprocessor is configured for collecting, sampling the measurement signals to thereby obtain measured values, for digitizing the measured values to thereby obtain measurement data, for averaging the measurement data to thereby obtain averaged measurement data, and for forwarding the averaged measurement data to said central processing unit.

11. The electrical device according to claim 10, wherein said central processing unit is configured for receiving the averaged measurement data, for further processing the measurement data to thereby obtain processed measurement data, for storing the processed measurement data in said memory unit, and for transmitting the processed measurement data to said GSM module.

12. The electrical device according to claim 1, wherein said at least one communication unit comprises a logic unit.

13. The electrical device according to claim 12, wherein said logic unit is actuatable via said GSM module.

14. The electrical device according to claim 1, wherein said at least one communication unit comprises a protective housing equipped with access openings, and said housing is completely encapsulated in said protective housing.

15. The electrical device according to claim 1, wherein said at least one communication unit is arranged inside a switch cabinet.

* * * * *

UNITED STATES PATENT AND TRADEMARK OFFICE
CERTIFICATE OF CORRECTION

PATENT NO. : 12,020,856 B2
APPLICATION NO. : 17/049085
DATED : June 25, 2024
INVENTOR(S) : Laszlo Bajai et al.

Page 1 of 1

It is certified that error appears in the above-identified patent and that said Letters Patent is hereby corrected as shown below:

In the Claims

Column 10, Lines 15-32 Claim 1 should read as follows:
1. An electrical device for connection to a high-voltage supply system, the electrical device comprising:
    a magnetizable core;
    at least one winding which is configured for generating a magnetic field in said core;
    a group of measurement sensors having outputs for providing measurement signals;
    at least one communication unit having a housing containing a GSM module, a plurality of analog measurement inputs, and a plurality of digital measurement inputs respectively connected to said outputs of some of said measurement sensors;
    said plurality of analog measurement inputs each having an energy supply unit with an energy source, overcurrent protection, and polarization protection; and
    said at least one communication unit being configured for processing measurement data obtained from the measurement signals received at said measurement inputs.

Signed and Sealed this
Twenty-seventh Day of August, 2024

Katherine Kelly Vidal
*Director of the United States Patent and Trademark Office*